United States Patent
Li et al.

(10) Patent No.: US 10,101,733 B2
(45) Date of Patent: Oct. 16, 2018

(54) DISPATCHING METHOD AND SYSTEM

(71) Applicant: Semiconductor Manufacturing International (Shanghai) Corporation, Shanghai (CN)

(72) Inventors: Hong Li, Shanghai (CN); Hao Zhang, Shanghai (CN); Ke Xiao, Shanghai (CN)

(73) Assignee: SEMICONDUCTOR MANUFACTURING INTERNATIONAL (SHANGHAI) CORPORATION (CN)

( * ) Notice: Subject to any disclaimer, the term of this patent is extended or adjusted under 35 U.S.C. 154(b) by 270 days.

(21) Appl. No.: 14/840,587

(22) Filed: Aug. 31, 2015

(65) Prior Publication Data
US 2016/0064261 A1 Mar. 3, 2016

(30) Foreign Application Priority Data
Sep. 1, 2014 (CN) .......................... 2014 1 0440424

(51) Int. Cl.
*G05B 19/418* (2006.01)
*H01L 21/67* (2006.01)

(52) U.S. Cl.
CPC .......... *G05B 19/41865* (2013.01); *G05B 2219/32247* (2013.01); *G05B 2219/32283* (2013.01); *G05B 2219/32313* (2013.01); *G05B 2219/45031* (2013.01); *H01L 21/67276* (2013.01); *Y02P 90/02* (2015.11); *Y02P 90/20* (2015.11)

(58) Field of Classification Search
None
See application file for complete search history.

(56) References Cited

U.S. PATENT DOCUMENTS 6,519,498 B1 * 2/2003 Jevtic ............... G05B 19/41865
700/100
2005/0288817 A1 * 12/2005 Chen ................. H01L 21/67253
700/213

(Continued)

FOREIGN PATENT DOCUMENTS

CN 1499570 A 5/2004
CN 1996181 A 7/2007

(Continued)

*Primary Examiner* — Dennis M Butler
(74) *Attorney, Agent, or Firm* — Innovation Counsel LLP

(57) ABSTRACT

A method of dispatching wafer lots through a plurality of process chambers, wherein the process chambers are disposed in at least one machine. The method includes: receiving wafer lot information and process chamber data, wherein the wafer lot information identifies the wafer lots to be processed at the machine, and the process chamber data includes process information associated with the process chambers; determining a load factor of each process chamber based on the wafer lot information and process chamber data; receiving historical data of run lots previously processed through the process chambers, and determining a processing time of the wafer lots based on the historical data; generating a dispatching criteria for the wafer lots based on the load factors of the process chambers and the determined processing time of the wafer lots; and dispatching the wafer lots through the process chambers based on the dispatching criteria.

16 Claims, 2 Drawing Sheets

(56) References Cited

U.S. PATENT DOCUMENTS

| | | | | |
|---|---|---|---|---|
| 2010/0278622 A1* | 11/2010 | Huang | ................... | B66F 19/00 |
| | | | | 414/673 |
| 2014/0067110 A1* | 3/2014 | Lawson | ............ | H01L 21/67276 |
| | | | | 700/117 |
| 2014/0271083 A1* | 9/2014 | Caveney | ........... | H01L 21/67173 |
| | | | | 414/749.5 |

FOREIGN PATENT DOCUMENTS

| | | |
|---|---|---|
| CN | 101179043 | 5/2008 |
| CN | 101206728 A | 6/2008 |
| CN | 103064380 A | 4/2013 |
| CN | 103101704 A | 5/2013 |
| CN | 103413771 A | 11/2013 |

* cited by examiner

DISPATCHING METHOD AND SYSTEM

CROSS-REFERENCE TO RELATED APPLICATION

This application claims priority to Chinese Patent Application No. 201410440424.X filed on Sep. 1, 2014, the disclosure of which is incorporated herein by reference in its entirety.

BACKGROUND

Technical Field

The present disclosure relates to the field of semiconductor manufacturing, and more particularly to a method and system for dispatching materials (e.g., wafer lots) through process chambers in machines located inside a semiconductor manufacturing plant.

Description of the Related Art

At present, in a semiconductor manufacturing plant (fab), the number of equipment having process chambers typically constitutes about 40% of the total equipment in the entire fab. However, an existing real-time dispatcher (RTD) system in the fab usually only dispatches lots at the machine level, and do not take into account the different process chambers within the equipment.

For example, equipment that has process chambers often include at least two chambers (per machine) performing the same or different process. The process chambers in each machine may be operated in different modes, for example serial or parallel. Parallel mode means that different wafers from a same batch of wafers can simultaneously enter different chambers for processing. Serial mode means that the wafers are processed sequentially in the different chambers, from one chamber to the next.

In existing fabs, although an RTD system has been installed on most machines having process chambers, the RTD system can usually only support the host station operator in dispatching materials. In particular, the RTD system often lack the capability to accurately determine the loading conditions at the different process chambers based on the quantity of wafer lots awaiting processing at each machine. Since the RTD system cannot determine whether there is wafer pile-up at each machine, the task of allocating the workflow is often performed manually by an experienced engineer or technician, who would specify which wafer lot(s) goes to which process chamber. However, the current method of manually allocating the workflow is inefficient for high volume manufacturing. As a result, an existing RTD system is unable to maximize/optimize manufacturing throughput.

SUMMARY

The present disclosure addresses at least the above issues in an existing RTD system.

According to an embodiment of the inventive concept, a method of dispatching wafer lots through a plurality of process chambers is provided. The process chambers are disposed in at least one machine. The method includes: receiving wafer lot information and process chamber data, wherein the wafer lot information identifies the wafer lots to be processed at the machine, and the process chamber data includes process information associated with the process chambers; determining a loading factor of each process chamber based on the wafer lot information and the process chamber data; receiving historical data of running lots previously processed through the process chambers, and determining a processing time of the wafer lots based on the historical data; generating a dispatching criteria for the wafer lots based on the loading factors of the process chambers and the determined processing time of the wafer lots; and dispatching the wafer lots through the process chambers based on the dispatching criteria.

In some embodiments, generating the dispatching criteria and dispatching the wafer lots may further include: determining, based on the loading factors of the process chambers and the determined processing time of the wafer lots, whether the machine is in a wafer pile-up state; if the machine is in the wafer pile-up state: dispatching the wafer lots so as to first maximize an output of the machine, and then to maximize usage of the process chambers; if the machine is not in the wafer pile-up state: dispatching the wafer lots to maximize the usage of the process chambers.

In some embodiments, the process chambers may be operated in parallel mode, and the process chambers may be subject to the same process conditions, and wherein generating the dispatching criteria and dispatching the wafer lots may further include: if the machine is in the wafer pile-up state: dispatching the wafer lots based on a first criterion and then a second criterion, wherein the first criterion defines the wafer lot having the shortest processing time, and the second criterion defines the wafer lot that requires processing in the most number of process chambers; if the machine is not in the wafer pile-up state: dispatching the wafer lots based on the second criterion and then the first criterion.

In some embodiments, the process chambers may be operated in parallel mode, and the process chambers may be subject to different process conditions, and wherein generating the dispatching criteria and dispatching the wafer lots may further include: regardless whether the machine is in the wafer pile-up state: dispatching the wafer lots based on a first criterion and then a second criterion, wherein the first criterion defines the process chamber having the highest load factor among the process chambers that are idle, and the second criterion defines the wafer lot having the shortest processing time.

In some embodiments, the process chambers may be operated in serial mode, and wherein generating the dispatching criteria and dispatching the wafer lots may further include: if the machine is in the wafer pile-up state: dispatching the wafer lots based on a first criterion and then a second criterion, wherein the first criterion defines the wafer lot having the shortest processing time, and the second criterion defines the wafer lot that requires processing in the most number of process chambers; if the machine is not in the wafer pile-up state: dispatching the wafer lots based on the second criterion and then the first criterion.

In some embodiments, receiving the historical data of run lots previously processed through the process chambers, and determining the processing time of the wafer lots based on the historical data may further include: calculating a processing time required in each process for each wafer in each wafer lot, so as to determine the processing time of the wafer lots.

In some embodiments, the load factor of each process chamber may be determined as follows: Load factor of the process chamber=Total quantity to be processed by the process chamber/target wafer quantity; wherein the target wafer quantity is indicative of a wafer handling capability of the process chamber.

In some embodiments, the target wafer quantity may be determined based on production conditions on a production line and the historical data of the run lots.

According to another embodiment of the inventive concept, a system for dispatching wafer lots through a plurality of process chambers is provided. The process chambers are disposed in at least one machine. The system includes: a computing module and a dispatching module, wherein the computing module comprises a first computing module and a second computing module; the computing module is configured to receive wafer lot information, process chamber data, and historical data of run lots previously processed through the process chambers, wherein the wafer lot information identifies the wafer lots to be processed at the machine, and the process chamber data includes process information associated with the process chambers; the first computing module is configured to determine a load factor of each process chamber based on the wafer lot information and process chamber data; the second computing module is configured to determine a processing time of the wafer lots based on the historical data; and the dispatching module is configured to generate a dispatching criteria for the wafer lots based on the load factors of the process chambers and the determined processing time of the wafer lots, and dispatch the wafer lots through the process chambers based on the dispatching criteria.

In some embodiments, the dispatching module may include a first dispatching module and a second dispatching module; the first dispatching module may be configured to dispatch the wafer lots to the process chambers operating in parallel mode; and the second dispatching module may be configured to dispatch the wafer lots to the process chambers operating in serial mode.

In some embodiments, the first dispatching module may include a first dispatching sub-unit and a second dispatching sub-unit; the first dispatching sub-unit may be configured to dispatch the wafer lots to the process chambers subject to the same process conditions; and the second dispatching sub-unit may be configured to dispatch the wafer lots to the process chambers subject to different process conditions.

In some embodiments, when the process chambers are operated in parallel mode, and the process chambers are subject to the same process conditions: the dispatching module may be configured to receive the load factors of the process chambers and the determined processing time of the wafer lots, and determine, based on the load factors and the determined processing time, whether the equipment is in a wafer pile-up state; if the equipment is in the wafer pile-up state: the first dispatching sub-unit is configured to dispatch the wafer lots based on a first criterion and then a second criterion, wherein the first criterion defines the wafer lot having the shortest processing time, and the second criterion defines the wafer lot that requires processing in the most number of process chambers; if the equipment is not in the wafer pile-up state: the first dispatching sub-unit is configured to dispatch the wafer lots based on the second criterion and then the first criterion.

In some embodiments, when the process chambers are operated in parallel mode, and the process chambers are subject to different process conditions: the dispatching module may be configured to receive the load factors of the process chambers and the determined processing time of the wafer lots, wherein regardless whether the equipment is in a wafer pile-up state: the second dispatching sub-unit is configured to dispatch the wafer lots based on a first criterion and then a second criterion, wherein the first criterion defines the process chamber having the highest load factor among the process chambers that are idle, and the second criterion defines the wafer lot having the shortest processing time.

In some embodiments, when the process chambers are operated in serial mode: the dispatching module may be configured to receive the load factors of the process chambers and the determined processing time of the wafer lots, and determine, based on the load factors, whether the equipment is in a wafer pile-up state; if the equipment is in the wafer pile-up state: the second dispatching module is configured to dispatch the wafer lots based on a first criterion and then a second criterion, wherein the first criterion defines the wafer lot having the shortest processing time, and the second criterion defines the wafer lot that requires processing in the most number of process chambers; if the equipment is not in the wafer pile-up state: the second dispatching module is configured to dispatch the wafer lots based on the second criterion and then the first criterion.

In some embodiments, the second computing module may be configured to calculate a processing time required in each process for each wafer in each wafer lot, so as to determine the processing time of the wafer lots.

In some embodiments, the load factor of each process chamber may be determined as follows: Load factor of the process chamber=Total quantity to be processed by the process chamber/target wafer quantity; wherein the target wafer quantity is indicative of a wafer handling capability of the process chamber.

In some embodiments, the target wafer quantity may be determined based on production conditions on a production line and the historical data of the run lots.

BRIEF DESCRIPTION OF THE DRAWINGS

The accompanying drawings, which are incorporated herein and constitute a part of the specification, illustrate different embodiments of the inventive concept and, together with the detailed description, serve to describe more clearly the inventive concept.

DETAILED DESCRIPTION

Figure 1:
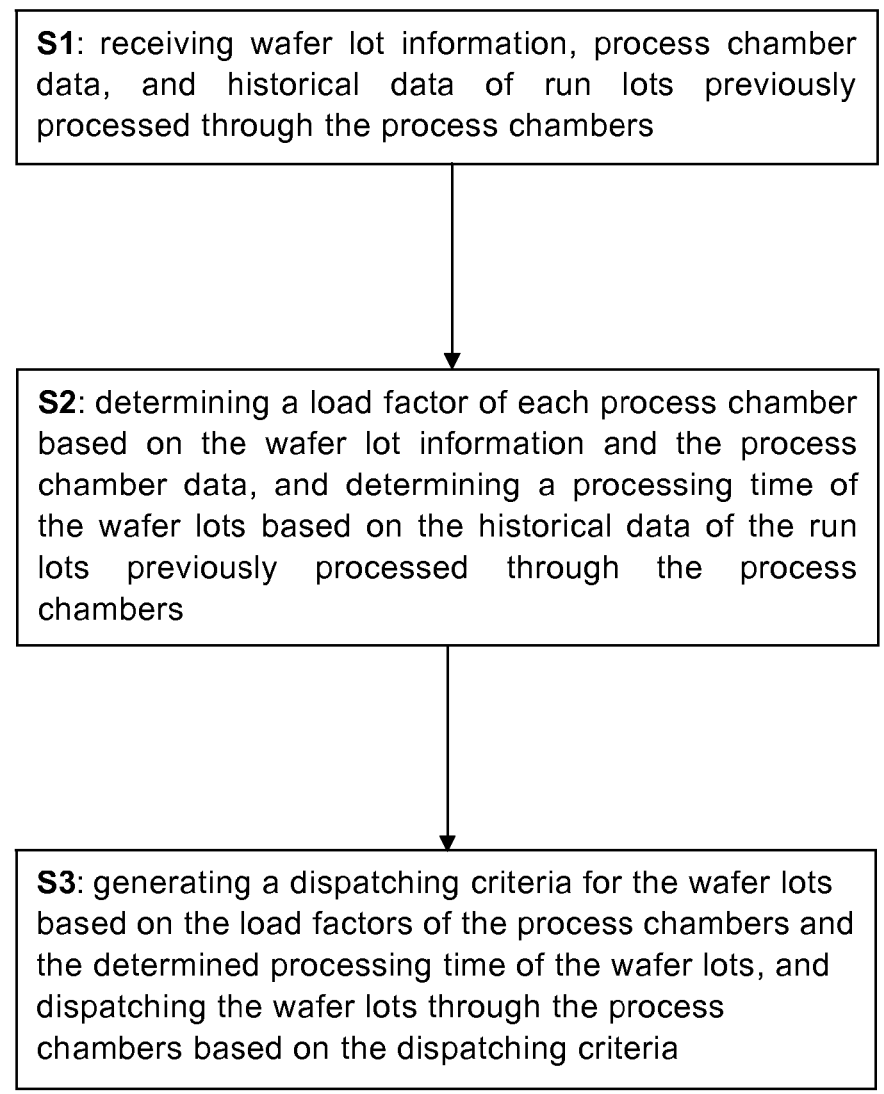
FIG. 1 is a flowchart illustrating a method of dispatching materials according to an embodiment.

Various embodiments of the inventive concept are next described in detail with reference to the accompanying drawings. It is noted that the following description of the different embodiments is merely illustrative in nature, and is not intended to limit the inventive concept, its application, or use. The relative arrangement of the components, and the numerical expressions and the numerical values set forth in these embodiments do not limit the scope of the inventive concept unless otherwise specifically stated. In addition, techniques, methods, and devices as known by those skilled in the art, although omitted in some instances, are intended to be part of the specification where appropriate. It should be noted that for convenience of description, the sizes of the elements in the drawings may not be drawn to scale.

It will be understood that, although the terms "first," "second," "third," etc. may be used herein to describe various elements, the elements should not be limited by those terms. Instead, those terms are merely used to distinguish one element from another. Thus, a "first" element discussed below could be termed a "second" element without departing from the teachings of the present inventive concept. As used herein, the term "and/or" includes any and all combinations of one or more of the associated listed items.

The terminology used herein is for the purpose of describing particular embodiments and is not intended to limit the inventive concept. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art, and should not be interpreted in an idealized or overly formal sense unless expressly so defined herein.

It should be understood that the inventive concept is not limited to the embodiments described herein. Rather, the inventive concept may be modified in different ways to realize different embodiments.

First, an exemplary method of dispatching materials to the process chambers in the equipment in a fab will be described with reference to FIG. 1. The materials may include at least one wafer lot. The exemplary method may include the following steps.

In Step S1, wafer lot information and process chamber data at each equipment are received. The wafer lot information includes the identity of the wafer lot(s) that is currently at the equipment and waiting to be processed. The process chamber data includes process information associated with the process chamber. For example, the process chamber data may include instructions for designating conditions in the chamber for processing the wafer lot. In addition, historical data of run lots previously processed through the chamber is also obtained.

The materials may include a plurality of wafer lots, for example, Lot 1, Lot 2, Lot 3, etc. The process chambers may include a plurality of chambers, for example, chamber A, chamber B, chamber C, etc. The process chamber data designates which wafer lot is to be processed at which chamber. For example, Lot 1 may be processed in chamber A and chamber B, Lot 2 may be processed in chamber C, etc. The historical data of the run lots for each equipment may reflect its loading history over a period of time, for example, in the past 60 days.

In some embodiments, Step S2 may include substeps (Steps S2.1 and S2.2). The substeps may be performed concurrently.

In Step S2.1, a load factor of each process chamber is determined based on the wafer lot information and the process chamber data. The load factor of each process chamber may be given by the following equation:

Load factor of the process chamber=Total quantity to be processed by the process chamber/target wafer quantity In the above equation, the "total quantity to be processed by the process chamber" refers to the number of wafer lots (out of the total number of wafer lots queued at the equipment) that requires processing in that particular chamber. For example, there may be a total of three wafer lots (Lot 1, Lot 2, and Lot 3) queued at the equipment. The equipment may include three process chambers (chamber A, chamber B, and chamber C). Within Lot 1, 20 wafers are to be processed in chamber A and 5 wafers are to be processed in chamber B. Within Lot 2, 5 wafers are to be processed in chamber B and 20 wafers are to be processed in chamber C. Within Lot 3, 10 wafers are to be processed in chamber A, 5 wafers are to be processed in chamber B, and 10 wafers are to be processed in chamber C. Accordingly, the total quantity to be processed by chamber A is 30 wafers (i.e., 20 wafers from Lot 1 and 10 wafers from Lot 3), the total quantity to be processed by chamber B is 15 wafers (i.e., 5 wafers from Lot 1, 5 wafers from Lot 2, and 5 wafers from Lot 3), and the total quantity to be processed by chamber C is 30 wafers (i.e., 20 wafers from Lot 2 and 10 wafers from Lot 3).

In the above equation, the "target wafer quantity" is indicative of a wafer handling capability of the process chamber. The target wafer quantity may be determined based on the production conditions on a production line and the historical data of the run lots. The target wafer quantity is usually closely related to the loading capability of each process chamber.

In Step S2.2, the processing time for each wafer in the wafer lot in the process chamber is determined based on the historical data of the run lots previously processed through the process chamber. Accordingly, the processing time for the wafer lots at each equipment can be determined since the cumulative processing times for the process chambers can be calculated.

In Step S3, a dispatching criteria for the wafer lots is generated, based on the load factors of the process chambers and the determined processing times of the wafer lots. Next, the wafer lots are dispatched through the process chambers based on the dispatching criteria.

In some embodiments, Step S3 may further include determining, based on the load factors of the process chambers and the determined processing time of the wafer lots, whether the equipment is in a wafer pile-up state. If the equipment is in a wafer pile-up state, the wafer lots may be dispatched based on the following considerations: first, to maximize the output of the equipment; and next, to maximize usage of the process chambers. Conversely, if the equipment is not in a wafer pile-up state, the wafer lots may be dispatched so as to only maximize usage of the process chambers.

In some embodiments, Step S3 may further include the following steps: obtaining the load factors of the process chambers and the determined processing times of the wafer lots, so as to obtain a run mode for each process chamber. The run mode is then used to determine the dispatching order for the wafer lots at each equipment.

The process chambers in the equipment may be operated in either parallel mode or serial mode. Within the parallel mode, the process chambers may be subject to the same process conditions or different process conditions.

Parallel Mode/Same Process Conditions

When the process chambers are operated in parallel mode and subject to the same process conditions, the processing time for each wafer lot is determined based on historical data of the run lots. The process chamber accepting the wafer lot that requires the least processing time is designated as the 'least used' chamber. The load factor for the 'least used' chamber is then calculated.

If the load factor is greater than 1, it means there is a wafer pile-up at the current machine. The unprocessed wafer lots are then dispatched according to the following criteria in order. The first criterion defines the wafer lot having the shortest processing time. The second criterion defines the wafer lot that requires processing in the most number of process chambers.

If the load factor is less than 1, it means there is no wafer pile-up at the current machine. The unprocessed wafer lots are then dispatched according to the following criteria in order. The first criterion defines the wafer lot that requires processing in the most number of process chambers. The second criterion defines the wafer lot having the shortest processing time.

The above sequence is depicted in Table 1, provided below.

TABLE 1

| Machine LP | Wafer Lot | Process chamber A | Process chamber B | Process chamber C | Total time (hrs) |
|---|---|---|---|---|---|
| LoadPord1 | LotX | Tx1 | | | 1.5 |
| LoadPord2 | LotY | | Ty2 | Ty3 | 2 |
| LoadPord3 | unknown | | | | |

Referring to Table 1, the machine loadpord includes LoadPord1, LoadPord2, and LoadPord3. It is observed that LoadPord1 and LoadPord2 are processing materials, whereas LoadPord3 is in an idle state. Tx1 and Ty2 are the processing times of LotX and LotY in chamber A and chamber B, respectively. Ty3 is the processing time of LotY in chamber C. If both LotX and LotY enter the machine simultaneously, it can be determined from Table 1 that process chamber A will be the first to enter an idle state, since the processing time for LotX is shorter than the processing time for LotY.

However, if LotX and LotY do not enter the machine simultaneously, the remaining processing time can be calculated as follows:

Remaining processing time=Total processing time−(Current time−Time at which the Lot enters the machine)

The process chamber with the shortest remaining processing time will be the first to enter an idle state. When chamber A is the first to enter an idle state, the wafer lots that are to be processed in chamber A are taken into consideration first, and then the load factor for chamber A is calculated. If the load factor is greater than 1, it means there is a wafer pile-up at the current machine. Conversely, if the load factor is less than 1, it means there is no wafer pile-up at the current machine. The above sequence is depicted in Table 2, provided below.

TABLE 2

| Wafer Lot No. | Process chamber | Processing time (hrs) | | | Total time (hrs) | Dispatch sequence (wafer pile-up) | Dispatch sequence (no wafer pile-up) |
| | | Process chamber A | Process chamber B | Process chamber C | | | |
|---|---|---|---|---|---|---|---|
| LotA | AB | Ta1 | Ta2 | | 2 | 1 | 2 |
| LotB | ABC | Tb1 | Tb2 | Tb3 | 3 | 2 | 1 |
| LotC | BC | | Tc2 | Tc3 | 2 | 3 | 3 |

Since process chamber A is the first to enter an idle state, when there is a wafer pile-up, the wafer lots will be dispatched according to the following criteria in order. The first criterion defines the wafer lot having the shortest processing time, and the second criterion defines the wafer lot that requires processing in the most number of process chambers. According to Table 2, the dispatching sequence will be such that LotA first undergoes processing, followed by LotB, with LotC being the last to be processed.

However, when there is no wafer pile-up, the wafer lots will be dispatched according to the following criteria in order. The first criterion defines the wafer lot that requires processing in the most number of process chambers, and the second criterion defines the wafer lot having the shortest processing time. According to Table 2, the dispatching sequence will be such that LotB first undergoes processing, followed by LotA, with LotC being the last to be processed.

Based on the above, it is observed that the order of the criteria for dispatching the wafers lots is reversed if the machine goes from the wafer pile-up state to a no wafer pile-up state.

Parallel Mode/Different Process Conditions

If the process chambers are operated in parallel mode but subject to different process conditions, after a particular wafer lot has been processed, the remaining unprocessed wafer lots are dispatched according to the following criteria in order. The first criterion defines the process chamber having the highest load factor among the process chambers that are in an idle state. The second criterion defines the wafer lot having the shortest processing time. For example, referring to Table 3 below, LoadPord1 may be in a processing state, whereby different process chambers are subject to different process conditions, and process chamber B and process chamber C are in an idle state.

TABLE 3

| Machine LP | Wafer lot | Process chamber A | Process chamber B | Process chamber C | Total time (hrs) |
|---|---|---|---|---|---|
| LoadPord1 | LotX | Tx1 | | | 1.5 |
| LoadPord2 | unknown | | | | |

Table 4 below illustrates the case in which the load factor and total processing time of the remaining process chambers are taken into account.

TABLE 4

| Wafer Lot No. | Process chamber | Processing time (hrs) | | | | Total time (hrs) | Load factor | Dispatch sequence |
| | | Process chamber A | Process chamber B | Process chamber C | Process chamber C | | | |
|---|---|---|---|---|---|---|---|---|
| LotA | A | Ta1 | | | | 3 | 1.0 | 4 |
| LotB | B | | Tb2 | | | 1 | 2.0 | 1 |
| LotC | B | | Tc2 | | | 2 | 2.0 | 2 |
| LotD | C | | | Td3 | | 2 | 0.7 | 3 |

As shown in Table 4, LotB and LotC are to be processed in process chamber B and LotC is to be processed in process chamber C. As mentioned above, the first criterion defines the process chamber having the highest load factor among the process chambers that are in an idle state, and the second criterion defines the wafer lot having the shortest processing time. Referring to Tables 3 and 4, it is determined that the load factor of process chamber B with respect to LotB and LotC is the highest (2.0), based on the first criterion. Using the second criterion, it is determined that the total processing time of LotB in process chamber B is the least. Accordingly, based on the above criteria, the dispatching sequence will be in the following order: LotB first, followed by LotC, and then LotD, with LotA being the last to be processed.

It is noted that the when the process chambers are operated in parallel mode and the process chambers are subject to different conditions, the wafer lots are dispatched according to the above-described criteria regardless whether the machine is in a wafer pile-up state.

Serial Mode

When the process chambers in the machine are operated in serial mode, it is first determined, based on the load factor of each process chamber, whether the machine is in a wafer pile-up state.

If the machine is in a wafer pile-up state, the wafer lots may be dispatched according to the following criteria in order. The first criterion defines the wafer lot having the shortest processing time. The second criterion defines the wafer lot that requires processing in the most number of process chambers.

Conversely, if the machine is not in a wafer pile-up state, the wafer lots may be dispatched according to the following criteria in order. The first criterion defines the wafer lot that requires processing in the most number of process chambers. The second criterion defines the wafer lot having the shortest processing time.

The above sequence is depicted in Table 5, provided below.

TABLE 5

| Wafer Lot No. | Process chamber | Processing time (hrs) | | | Total time (hrs) | Dispatch sequence (wafer pile-up) | Dispatch sequence (no wafer pile-up) |
| --- | --- | --- | --- | --- | --- | --- | --- |
| | | Process chamber A | Process chamber B | Process chamber C | | | |
| LotA | AB | Ta1 | Ta2 | | 1 | 2 | 3 |
| LotB | ABC | Tb1 | Tb2 | Tb3 | 1 | 1 | 1 |
| LotC | BC | | Tc2 | Tc3 | 2 | 3 | 4 |
| LotD | ABC | Td1 | Td2 | Td3 | 4 | 4 | 2 |
| LotE | BC | | Te2 | Te3 | 4 | 5 | 5 |

Referring to Table 5, assuming the quantity of wafers processed by the three process chambers is the same as the target wafer quantity, since five wafer lots are to be processed in process chamber B, therefor the quantity processed in process chamber B will be the highest.

Load factor of the process chamber=Total quantity to be processed by the process chamber/target wafer quantity Based on the above equation, it is determined that the load factor of process chamber B is the highest. When the machine is in a wafer pile-up state, the wafer lots may be dispatched according to the following criteria in order. The first criterion defines the wafer lot having the shortest processing time. The second criterion defines the wafer lot that requires processing in the most number of process chambers.

As shown in Table 5, it is determined that the total processing time for LotA and LotB is the smallest. Next, the number of process chambers required to process LotA and LotB is taken into account. Since LotB requires three process chambers for processing whereas LotA only requires two process chambers for processing, LotB will therefore be processed first. Using the above method, the dispatching sequence is determined to be in the following order: LotB first, followed by LotA, then LotC, and then LotD, with LotE being the last to be processed.

Conversely, when the machine is not in a wafer pile-up state, the wafer lots may be dispatched according to the following criteria in order. The first criterion defines the wafer lot that requires processing in the most number of process chambers. The second criterion defines the wafer lot having the shortest processing time. Referring to Table 5, it is determined that LotB and LotD are to be processed in the most number of process chambers. Next, the total processing time for LotB and LotD is taken into account. Since the total processing time required for LotB is less than the total processing time required for LotD, LotB will therefore be processed first. Using the above method, the dispatching sequence is determined to be in the following order: LotB first, followed by LotD, then LotA, and then LotC, with LotE being the last to be processed.

Figure 2:
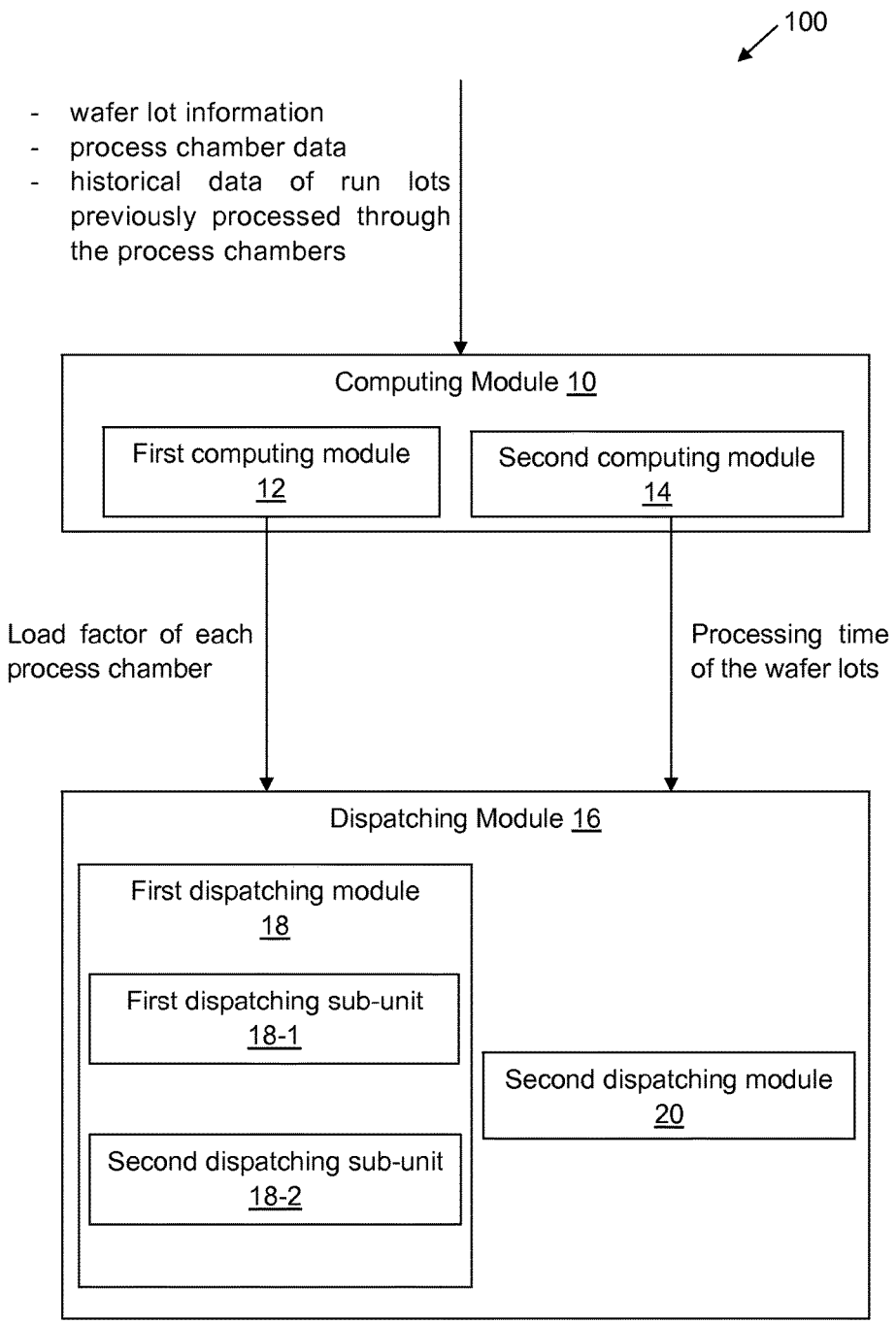
FIG. 2 is a schematic block diagram of a dispatching system according to an embodiment.

FIG. 2 is a schematic block diagram of a dispatching system according to an embodiment. The system is configured to dispatch wafer lots through a plurality of process chambers. The process chambers may be disposed in at least one machine. Referring to FIG. 2, system 100 includes a computing module 10 and a dispatching module 16.

The computing module 10 includes a first computing module 12 and a second computing module 14. The computing module 10 is configured to receive wafer lot information, process chamber data, and historical data of run lots previously processed through the process chambers. The wafer lot information identifies the wafer lots to be processed at the machine, and the process chamber data includes process information associated with the process chambers. The first computing module 12 is configured to determine a load factor of each process chamber based on the wafer lot information and process chamber data. The second computing module 14 is configured to determine a processing time of the wafer lots based on the historical data. The dispatching module 16 is configured to generate a dispatching criteria for the wafer lots based on the load factors of the process chambers and the determined processing time of the wafer lots, and dispatch the wafer lots through the process chambers based on the dispatching criteria.

If the machine is in a wafer pile-up state, the wafer lots may be dispatched based on the following considerations: first, to maximize the output of the machine; and next, to maximize usage of the process chambers. Conversely, if the machine is not in a wafer pile-up state, the wafer lots may be dispatched so as to only maximize usage of the process chambers.

In some embodiments, the dispatching module 16 further includes a first dispatching module 18 and a second dispatching module 20. The first dispatching module 18 is configured to dispatch the wafer lots to the process chambers operating in parallel mode. The second dispatching module 20 is configured to dispatch the wafer lots to the process chambers operating in serial mode.

In some embodiments, the first dispatching module 18 further includes a first dispatching sub-unit 18-1 and a second dispatching sub-unit 18-2. The first dispatching sub-unit 18-1 is configured to dispatch the wafer lots to the process chambers subject to the same process conditions. The second dispatching sub-unit 18-2 is configured to dispatch the wafer lots to the process chambers subject to different process conditions.

Next, the operation of the system in FIG. 2 will be described in further detail.

In one embodiment of the system, after the computing module 10 receives wafer lot information, process chamber data, and historical data of run lots previously processed through the process chambers, the first computing module 12 determines a load factor of each process chamber based on the wafer lot information and process chamber data. At the same time, the second computing module 14 determines a processing time of the wafer lots based on the historical data. Next, the dispatching module 16 generates a dispatching criteria for the wafer lots based on the load factors of the process chambers and the determined processing time of the wafer lots, and dispatches the wafer lots through the process chambers based on the dispatching criteria.

The process chambers in the machine may be operated in either parallel mode or serial mode. Within each mode, the process chambers may be subject to either the same process conditions or different process conditions.

Parallel Mode/Same Process Conditions

In some embodiments, the machine may include a plurality of process chambers operating in parallel mode, whereby the process chambers are subject to the same process conditions. In those embodiments, the dispatching module 16 receives the load factors of the process chambers and the determined processing time of the wafer lots, and determines, based on the load factors and the determined processing time, whether the machine is in a wafer pile-up state. If the machine is in a wafer pile-up state: the first dispatching sub-unit 18-1 dispatches the wafer lots based on the following criteria in order. The first criterion defines the wafer lot having the shortest processing time. The second criterion defines the wafer lot that requires processing in the most number of process chambers.

Conversely, if the machine is not in a wafer pile-up state: the first dispatching sub-unit 18-1 dispatches the wafer lots based on the following criteria in order. The first criterion defines the wafer lot that requires processing in the most number of process chambers. The second criterion defines the wafer lot having the shortest processing time.

Parallel Mode/Different Process Conditions

In some embodiments, the machine may include a plurality of process chambers operating in parallel mode, whereby the process chambers are subject to different process conditions. In those embodiments, the dispatching module 16 receives the load factors of the process chambers and the determined processing time of the wafer lots. The second dispatching sub-unit 18-2 dispatches the wafer lots according to the following criteria in order regardless whether the machine is in a wafer pile-up state. The first criterion defines the process chamber having the highest load factor among the process chambers that are idle. The second criterion defines the wafer lot having the shortest processing time.

Serial Mode

In some embodiments, the machine may include a plurality of process chambers operating in serial mode. In those embodiments, the dispatching module 16 receives the load factors of the process chambers and the determined processing time of the wafer lots, and determines, based on the load factors, whether the machine is in a wafer pile-up state. If the machine is in a wafer pile-up state, the second dispatching module 20 dispatches the wafer lots according to the following criteria in order. The first criterion defines the wafer lot having the shortest processing time. The second criterion defines the wafer lot that requires processing in the most number of process chambers.

Conversely, if the machine is not in a wafer pile-up state, the second dispatching module 20 dispatches the wafer lots according to the following criteria in order. The first criterion defines the wafer lot that requires processing in the most number of process chambers. The second criterion defines the wafer lot having the shortest processing time.

Using the above system and methods, materials can be dispatched to the various process chambers in the machines, taking into account whether the machines are in a wafer pile-up state. Accordingly, the wafers can be processed more efficiently, thereby improving production capability and usage of the machines.

Embodiments of a dispatching system and method have been described in the foregoing description. To avoid obscuring the inventive concept, details that are well-known in the art may have been omitted. Nevertheless, those skilled in the art would be able to understand the implementation of the inventive concept and its technical details in view of the present disclosure.

The different embodiments of the inventive concept have been described with reference to the accompanying drawings. However, the different embodiments are merely illustrative and are not intended to limit the scope of the inventive concept. Furthermore, those skilled in the art would appreciate that various modifications can be made to the different embodiments without departing from the scope of the inventive concept.

What is claimed is:

1. A method of dispatching wafer lots through a plurality of process chambers, wherein the process chambers are disposed in a machine having a computing module and a dispatching module and at least one processor and at least one memory, the method comprising:
   receiving, via the computing module, wafer lot information, process chamber data, and historical data of run lots previously processed through the process chambers, wherein the wafer lot information identifies the wafer lots to be processed at the machine, and the process chamber data includes process information associated with the process chambers;
   determining, via the computing module, a load factor of each process chamber based on the wafer lot information and the process chamber data;
   determining, via the computing module, a processing time of the wafer lots based on the historical data;
   generating, via the dispatching module, a dispatching criteria for the wafer lots based on the load factors of the process chambers and the determined processing time of the wafer lots; and
   dispatching, via the dispatching module, the wafer lots through the process chambers based on the dispatching criteria;
   wherein generating the dispatching criteria and dispatching the wafer lots comprises:
      determining, based on the load factors of the process chambers and the determined processing time of the wafer lots, whether the machine is in a wafer pile-up state;
      if the machine is in the wafer pile-up state: dispatching the wafer lots so as to first maximize an output of the machine, and then to maximize usage of the process chambers;
      if the machine is not in the wafer pile-up state: dispatching the wafer lots to maximize the usage of the process chambers.

2. The method according to claim 1, wherein the process chambers are operated in parallel mode, and the process chambers are subject to the same process conditions, and wherein generating the dispatching criteria and dispatching the wafer lots further comprises:

if the machine is in the wafer pile-up state: dispatching the wafer lots based on a first criterion and then a second criterion, wherein the first criterion defines a wafer lot having the shortest processing time, and the second criterion defines the wafer lot that requires processing in the most number of process chambers;

if the machine is not in the wafer pile-up state: dispatching the wafer lots based on the second criterion and then the first criterion.

3. The method according to claim 1, wherein the process chambers are operated in parallel mode, and the process chambers are subject to different process conditions, and wherein generating the dispatching criteria and dispatching the wafer lots further comprises:

regardless whether the machine is in the wafer pile-up state: dispatching the wafer lots based on a first criterion and then a second criterion, wherein the first criterion defines the process chamber having the highest load factor among the process chambers that are idle, and the second criterion defines the wafer lot having the shortest processing time.

4. The method according to claim 1, wherein the process chambers are operated in serial mode, and wherein generating the dispatching criteria and dispatching the wafer lots further comprises:

if the machine is in the wafer pile-up state: dispatching the wafer lots based on a first criterion and then a second criterion, wherein the first criterion defines the wafer lot having the shortest processing time, and the second criterion defines the wafer lot that requires processing in the most number of process chambers;

if the machine is not in the wafer pile-up state: dispatching the wafer lots based on the second criterion and then the first criterion.

5. The method according to claim 1, wherein receiving the historical data of run lots previously processed through the process chambers, and determining the processing time of the wafer lots based on the historical data further comprises:

calculating a processing time required in each process for each wafer in each wafer lot, so as to determine the processing time of the wafer lots.

6. The method according to claim 1, wherein the load factor of each process chamber is determined as follows:

Load factor of the process chamber=Total quantity to be processed by the process chamber/target wafer quantity;

wherein the target wafer quantity is indicative of a wafer handling capability of the process chamber.

7. The method according to claim 6, wherein the target wafer quantity is determined based on production conditions on a production line and the historical data of the run lots.

8. A computer-implemented system for dispatching wafer lots through a plurality of process chambers, wherein the process chambers are disposed in a machine, wherein the system comprises at least one processor and at least one memory, the system further comprising:

a computing module and a dispatching module, wherein the computing module comprises a first computing module and a second computing module;

the computing module is configured to receive wafer lot information, process chamber data, and historical data of run lots previously processed through the process chambers, wherein the wafer lot information identifies the wafer lots to be processed at the machine, and the process chamber data includes process information associated with the process chambers;

the first computing module is configured to determine a load factor of each process chamber based on the wafer lot information and process chamber data;

the second computing module is configured to determine a processing time of the wafer lots based on the historical data; and the dispatching module is configured to generate a dispatching criteria for the wafer lots based on the load factors of the process chambers and the determined processing time of the wafer lots, and dispatch the wafer lots through the process chambers based on the dispatching criteria wherein the dispatching module comprises a first dispatching module and a second dispatching module;

the first dispatching module is configured to dispatch the wafer lots to the process chambers operating in parallel mode; and the second dispatching module is configured to dispatch the wafer lots to the process chambers operating in serial mode;

wherein the first dispatching module comprises a first dispatching sub-unit and a second dispatching sub-unit;

the first dispatching sub-unit is configured to dispatch the wafer lots to the process chambers subject to the same process conditions; and the second dispatching sub-unit is configured to dispatch the wafer lots to the process chambers subject to different process conditions wherein when the process chambers are operated in parallel mode, and the process chambers are subject to the same process conditions:

the dispatching module is configured to receive the load factors of the process chambers and the determined processing time of the wafer lots, and determine, based on the load factors and the determined processing time, whether the machine is in a wafer pile-up state;

if the machine is in the wafer pile-up state: the first dispatching sub-unit is configured to dispatch the wafer lots based on a first criterion and then a second criterion, wherein the first criterion defines the wafer lot having the shortest processing time, and the second criterion defines the wafer lot that requires processing in the most number of process chambers;

if the machine is not in the wafer pile-up state: the first dispatching sub-unit is configured to dispatch the wafer lots based on the second criterion and then the first criterion.

9. The system according to claim 8, wherein when the process chambers are operated in parallel mode, and the process chambers are subject to different process conditions:

the dispatching module is configured to receive the load factors of the process chambers and the determined processing time of the wafer lots, wherein regardless whether the machine is in a wafer pile-up state:

the second dispatching sub-unit is configured to dispatch the wafer lots based on a first criterion and then a second criterion, wherein the first criterion defines a process chamber having the highest load factor among the process chambers that are idle, and the second criterion defines a wafer lot having the shortest processing time.

10. The system according to claim 8, wherein when the process chambers are operated in serial mode:

the dispatching module is configured to receive the load factors of the process chambers and the determined processing time of the wafer lots, and determine, based on the load factors, whether the machine is in a wafer pile-up state;

if the machine is in the wafer pile-up state: the second dispatching module is configured to dispatch the wafer lots based on a first criterion and then a second criterion, wherein the first criterion defines a wafer lot having the shortest processing time, and the second criterion defines the wafer lot that requires processing in the most number of process chambers;

if the machine is not in the wafer pile-up state: the second dispatching module is configured to dispatch the wafer lots based on the second criterion and then the first criterion.

11. The system according to claim 8, wherein the second computing module is configured to calculate a processing time required in each process for each wafer in each wafer lot, so as to determine the processing time of the wafer lots.

12. The system according to claim 8, wherein the load factor of each process chamber is determined as follows:

Load factor of the process chamber=Total quantity to be processed by the process chamber/target wafer quantity;

wherein the target wafer quantity is indicative of a wafer handling capability of the process chamber.

13. The system according to claim 12, wherein the target wafer quantity is determined based on production conditions on a production line and the historical data of the run lots.

14. A set of tangible, non-transitory computer readable medium storing instructions that, when executed by one or more computer-implemented modules and at least one processor and at least one memory, cause the one or more computer-implemented modules to perform a method of dispatching wafer lots through a plurality of process chambers, wherein the process chambers are disposed in a machine, and wherein the one or more computer-implemented modules comprises a dispatching module and a computing module including a first computing module and a second computing module, the method comprising:

receiving, using the computing module, wafer lot information, process chamber data, and historical data of run lots previously processed through the process chambers, wherein the wafer lot information identifies the wafer lots to be processed at the machine, and the process chamber data includes process information associated with the process chambers;

determining, using the first computing module, a load factor of each process chamber based on the wafer lot information and process chamber data;

determining, using the second computing module, a processing time of the wafer lots based on the historical data; and generating, using the dispatching module, a dispatching criteria for the wafer lots based on the load factors of the process chambers and the processing time of the wafer lots determined by the first and second computing modules, and dispatching the wafer lots through the process chambers based on the dispatching criteria;

wherein generating the dispatching criteria and dispatching the wafer lots comprises:

determining, based on the load factors of the process chambers and the determined processing time of the wafer lots, whether the machine is in a wafer pile-up state;

if the machine is in the wafer pile-up state: dispatching the wafer lots so as to first maximize an output of the machine, and then to maximize usage of the process chambers;

if the machine is not in the wafer pile-up state: dispatching the wafer lots to maximize the usage of the process chambers.

15. The set of tangible, non-transitory computer readable medium storing instructions of claim 14, wherein the dispatching module further comprises a first dispatching module and a second dispatching module, the method further comprising:

dispatching the wafer lots to the process chambers operating in parallel mode using the first dispatching module; and dispatching the wafer lots to the process chambers operating in serial mode using the second dispatching module.

16. The set of tangible, non-transitory computer readable medium storing instructions of claim 15, wherein the first dispatching module further comprises a first dispatching sub-unit and a second dispatching sub-unit, the method further comprising:

dispatching the wafer lots to the process chambers subject to the same process conditions using the first dispatching sub-unit; and dispatching the wafer lots to the process chambers subject to different process conditions using the second dispatching sub-unit.

* * * * *